(12) United States Patent
Kleimaier et al.

(10) Patent No.: US 12,328,926 B1
(45) Date of Patent: Jun. 10, 2025

(54) STRUCTURES FOR A FIELD-EFFECT TRANSISTOR THAT INCLUDE A SPACER STRUCTURE

(71) Applicant: GlobalFoundries U.S. Inc., Malta, NY (US)

(72) Inventors: Dominik Martin Kleimaier, Dresden (DE); Ruchil Kumar Jain, Dresden (DE); Jan Höntschel, Dresden (DE); Peter Javorka, Dresden (DE); Steven Langdon, Dresden (DE); Felix Holzmüller, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/675,367

(22) Filed: May 28, 2024

(51) Int. Cl.
| | |
|---|---|
| *H10D 64/27* | (2025.01) |
| *H01L 21/762* | (2006.01) |
| *H10D 30/60* | (2025.01) |
| *H10D 86/00* | (2025.01) |

(52) U.S. Cl.
CPC ..... *H10D 64/514* (2025.01); *H01L 21/76267* (2013.01); *H10D 30/603* (2025.01); *H10D 86/201* (2025.01)

(58) Field of Classification Search
CPC .......... H01L 29/42364; H01L 29/7835; H01L 21/76267; H01L 21/1203
See application file for complete search history.

(56) References Cited

U.S. PATENT DOCUMENTS

| | | | |
|---|---|---|---|
| 8,431,994 B2* | 4/2013 | Chan | H10D 30/63 257/412 |
| 8,507,989 B2* | 8/2013 | Khakifirooz | H01L 27/1203 257/E29.283 |
| 9,559,119 B2 | 1/2017 | Cheng et al. | |
| 2016/0093638 A1* | 3/2016 | Cheng | H01L 21/26513 438/151 |
| 2016/0276480 A1* | 9/2016 | Liu | H01L 29/0649 |
| 2017/0317106 A1 | 11/2017 | Boivin et al. | |
| 2021/0336006 A1* | 10/2021 | Chen | H01L 29/78618 |

OTHER PUBLICATIONS

D. Lipp et al., "Excellent Reliability performances of a truly 5V nBOXFET for Automotive and IOT applications," 2023 IEEE International Reliability Physics Symposium (IRPS), Monterey, CA, USA, 2023, pp. 1-5, doi: 10.1109/IRPS48203.2023.10117689.
(Continued)

*Primary Examiner* — Shaun M Campbell
(74) *Attorney, Agent, or Firm* — Thompson Hine LLP (57) ABSTRACT

Structures for a field-effect transistor and methods of forming a structure for a field-effect transistor. The structure comprises a silicon-on-insulator substrate including a semiconductor substrate, a dielectric layer on the semiconductor substrate, and a semiconductor layer on the dielectric layer. The structure further comprises a gate electrode on the semiconductor layer. The gate electrode comprises a single-crystal semiconductor material. The structure further comprises a spacer structure including a first portion that overlaps with a side surface of the dielectric layer and a second portion that overlaps with a portion of the semiconductor substrate adjacent to the side surface of the dielectric layer.

20 Claims, 7 Drawing Sheets

(56) References Cited

OTHER PUBLICATIONS

GlobalFoundries; "Wearable Display Driver using 55/28HV and 22FDX." Human Machine Interaction, 2 pages (2021).
F. Fahim et al.; Fermilab Microelectronics Initiative ASIC Research & Development Department; "ASIC Group at Fermilab: Strategy & Vision." U.S. Department of Energy, Office of Science; 32 pages (Nov. 17, 2021).
European Patent Office; Extended European Search Report and Opinion issued in European Patent Application No. 24210452.9 on Apr. 16, 2025; 10 pages.

* cited by examiner

STRUCTURES FOR A FIELD-EFFECT TRANSISTOR THAT INCLUDE A SPACER STRUCTURE

BACKGROUND

The disclosure relates to semiconductor device fabrication and integrated circuits and, more specifically, to structures for a field-effect transistor and methods of forming a structure for a field-effect transistor.

Complementary-metal-oxide-semiconductor (CMOS) processes may be employed to fabricate field-effect transistors that are used as devices in integrated circuits. A field-effect transistor generally includes a source region, a drain region, a body supplying a channel region between the source region and drain region, a gate electrode overlapped with the channel region, and a gate dielectric disposed between the gate electrode and the channel region. When a control voltage exceeding a characteristic threshold voltage is applied to the gate electrode, carrier flow occurs in the channel region between the source region and drain region to produce a device output current.

Field-effect transistors fabricated using silicon-on-insulator technologies may exhibit certain performance improvements in comparison with comparable devices fabricated using a bulk silicon substrate. A silicon-on-insulator substrate includes a device layer comprised of silicon, a semiconductor substrate, and a buried oxide layer physically separating and electrically isolating the device layer from the semiconductor substrate.

Field-effect transistors for operation at medium and high voltages may be fabricated using the buried oxide layer of the silicon-on-insulator substrate as a gate dielectric. This fabrication approach avoids the deposition of a thick dielectric layer on the device layer and subsequent patterning to form a suitable gate dielectric. The channel region of this type of field-effect transistor is located in the semiconductor substrate beneath the buried oxide layer, and the channel width of the channel region may be delimited by shallow trench isolation regions. However, an adverse consequence of delimiting the channel region with shallow trench isolation regions is the occurrence of a hump effect observed in the drain current with increasing gate voltage. Another adverse consequence is that a parasitic device associated with the shallow trench isolation regions causes roll-off in the drain current, at higher gate voltages, as the channel width is scaled.

Improved structures for a field-effect transistor and methods of forming a structure for a field-effect transistor are needed.

SUMMARY

In an embodiment of the invention, a structure for a field-effect transistor is provided. The structure comprises a silicon-on-insulator substrate including a semiconductor substrate, a dielectric layer on the semiconductor substrate, and a semiconductor layer on the dielectric layer. The structure further comprises a gate electrode on the semiconductor layer. The gate electrode comprises a single-crystal semiconductor material. The structure further comprises a spacer structure including a first portion that overlaps with a side surface of the dielectric layer and a second portion that overlaps with a portion of the semiconductor substrate adjacent to the side surface of the dielectric layer.

In an embodiment of the invention, a method of forming a structure for a field-effect transistor is provided. The method comprises forming a gate electrode on a semiconductor layer of a silicon-on-insulator substrate. The silicon-on-insulator substrate includes a semiconductor substrate and a dielectric layer disposed on the semiconductor substrate, and the semiconductor layer is disposed on the dielectric layer. The method further comprises forming a spacer structure including a first portion that overlaps with a side surface of the dielectric layer and a second portion that overlaps with a portion of the semiconductor substrate adjacent to the side surface of the dielectric layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
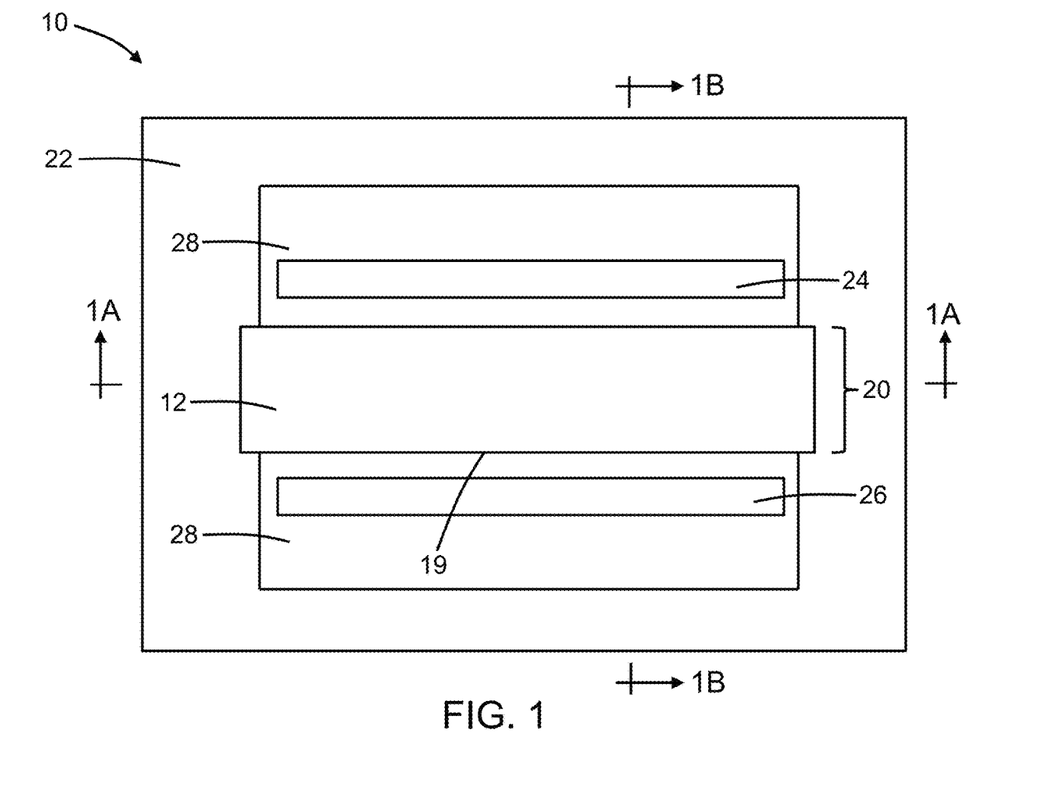
FIG. 1 is a top view of a structure at an initial fabrication stage of a processing method in accordance with embodiments of the invention.
Figure 1A:
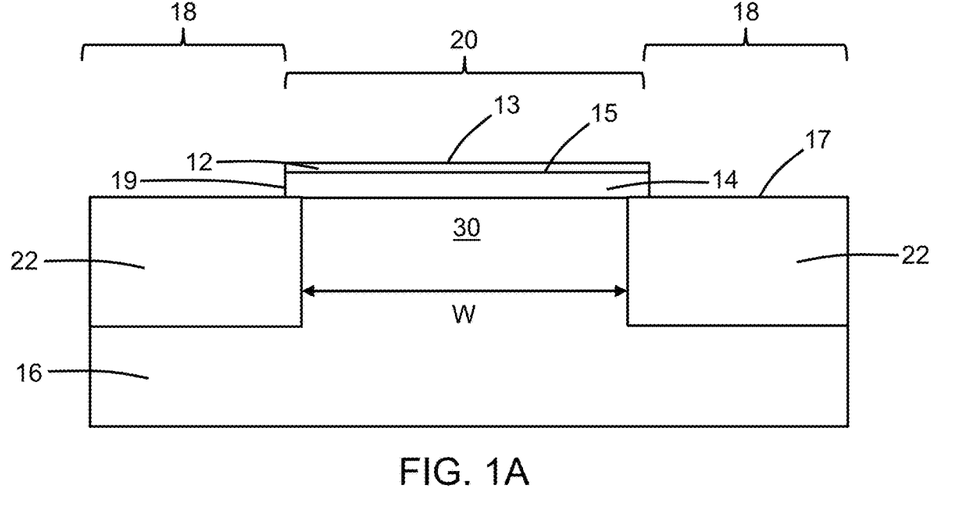
FIG. 1A is a cross-sectional view taken generally along line 1A-1A in FIG. 1.
Figure 1B:
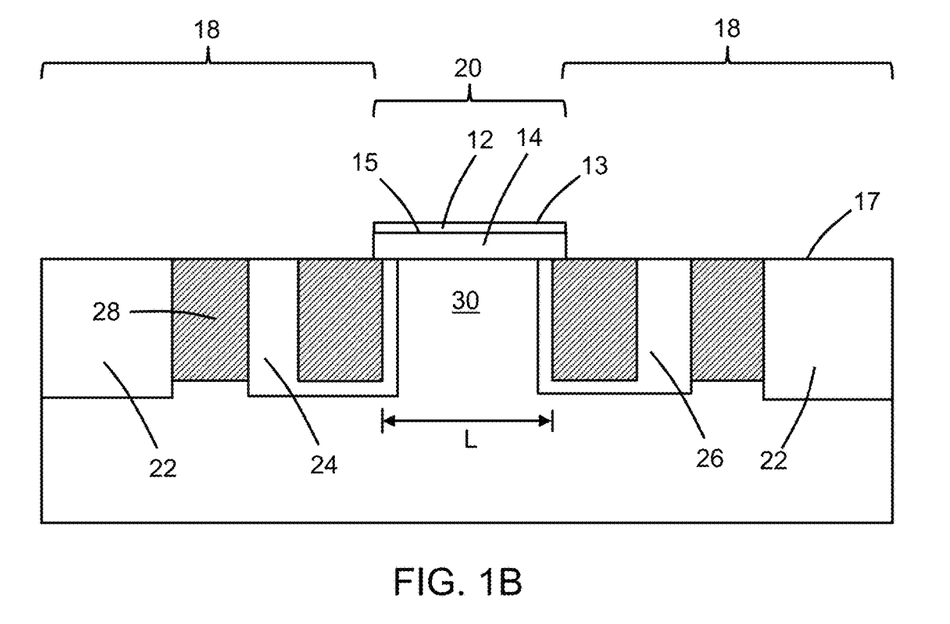
FIG. 1B is a cross-sectional view taken generally along line 1B-1B in FIG. 1.

With reference to FIGS. 1, 1A, 1B and in accordance with embodiments of the invention, a structure 10 for a field-effect transistor may be fabricated using a silicon-on-insulator substrate that includes a semiconductor layer 12, a semiconductor substrate 16, and a dielectric layer 14 disposed between the semiconductor layer 12 and the semiconductor substrate 16. The semiconductor layer 12 may be comprised of a semiconductor material, such as single-crystal silicon. The dielectric layer 14 may be comprised of a dielectric material, such as silicon dioxide, that is an electrical insulator. The semiconductor substrate 16 may be comprised of a semiconductor material, such as single-crystal silicon, that is lightly doped to have, for example, p-type conductivity. The semiconductor layer 12, which is physically separated and electrically isolated from the semiconductor substrate 16 by the intervening dielectric layer 14, may be significantly thinner than the semiconductor substrate 16. The dielectric layer 14 has a lower interface with the semiconductor substrate 16 and an upper interface with the semiconductor layer 12.

In an embodiment, the dielectric layer 14 may be a buried oxide layer of a silicon-on-insulator substrate, the semiconductor layer 12 may be a device layer of the silicon-oninsulator substrate, and the buried oxide layer provided by the dielectric layer 14 may separate the device layer provided by the semiconductor layer 12 from the semiconductor substrate 16. In an embodiment, the semiconductor layer 12 of the silicon-on-insulator substrate may have a thickness suitable to fabricate fully-depleted silicon-on-insulator device structures. In an embodiment, the semiconductor layer 12 may have a thickness in a range of about 4 nanometers to about 20 nanometers.

The semiconductor layer 12 and the dielectric layer 14 may be removed from a region 18 of the structure 10 by patterning with lithography and etching processes. The removal of the semiconductor layer 12 and the dielectric layer 14 reveals a portion of the semiconductor substrate 16 in the region 18 that surrounds a region 20 of the structure 10 in which the semiconductor layer 12 and the dielectric layer 14 are intact after patterning. The region 20 transitions to the region 18 at a side surface 19 that surrounds a perimeter (i.e., an outer boundary) of the semiconductor layer 12 and dielectric layer 14 in the region 20. The side surface 19, which is constituted by the coterminous side surfaces of the semiconductor layer 12 and dielectric layer 14, represents a stepped transition from the region 18 in which the semiconductor substrate 16 is revealed to the region 20 in which the semiconductor substrate 16 is buried and covered by preserved portions of the semiconductor layer 12 and dielectric layer 14. The semiconductor layer 12 includes a top surface 13 that intersects the side surface 19 and the dielectric layer 14 includes a top surface 15 that intersects the side surface 19. The semiconductor substrate 16 has a top surface 17 that is exposed in the region 18 and the side surface 19 terminates at the top surface 17 of the semiconductor substrate 16.

The structure 10 may include a well 22 that is formed in the semiconductor material of the semiconductor substrate 16 in the region 18. In an embodiment, the well 22 may surround the perimeter of the semiconductor layer 12 and dielectric layer 14 in the region 20. The well 22 may be formed by, for example, an ion implantation process using an implantation mask with an opening that exposes a portion of semiconductor substrate 16 in the region 18 to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 22. The implantation mask, which has a thickness adequate to stop the ions, may be stripped after forming the well 22. In an embodiment, the well 22 may contain a concentration of a p-type dopant, such as boron, that provides p-type conductivity.

The structure 10 may include a source region 24 and a drain region 26 that are formed in the semiconductor material of the semiconductor substrate 16 in the region 18. The source region 24 and drain region 26 are disposed adjacent to the side edges of the region 20 and are spaced outward from the side edges of the region 20. The source region 24 and drain region 26 may be formed by, for example, an ion implantation process using an implantation mask with openings that expose portions of the semiconductor substrate 16 in the region 18 to be implanted with ions. The implantation mask may include a layer of photoresist applied by a spin-coating process, pre-baked, exposed to light projected through a photomask, baked after exposure, and developed with a chemical developer to form the openings. The implantation conditions, such as ion species, dose, and kinetic energy, may be selected to tune the electrical and physical characteristics of the source region 24 and drain region 26. The implantation mask, which has a thickness adequate to stop the ions, may be stripped after forming the source region 24 and drain region 26. In an embodiment, the source region 24 and drain region 26 may contain a concentration of an n-type dopant, such as arsenic or phosphorus, that provides n-type conductivity.

Shallow trench isolation regions 28 are formed in the semiconductor substrate 16. The shallow trench isolation regions 28 may be formed by patterning shallow trenches with lithography and etching processes, depositing a dielectric material, such as silicon dioxide, to fill the shallow trenches, and planarizing and/or recessing the dielectric material. The semiconductor layer 12 and the dielectric layer 14 at opposite ends of the region 20 project outwardly beyond the outer perimeter of the shallow trench isolation regions 28.

A channel region 30 is disposed in the semiconductor substrate 16 laterally between the source region 24 and the drain region 26. The channel region 30 has a channel length L in a lateral direction between the source region 24 and the drain region 26, and the channel region 30 has a channel width W in a longitudinal direction orthogonal to the channel length L. The channel width W of the field-effect transistor embodied in the structure 10 is not delimited by the presence of the shallow trench isolation regions 28 at the transition between the region 18 and the region 20. Instead, portions of the well 22 are disposed at the transition between the region 18 and the region 20, and the side surface 19 overlaps with these portions of the well 22. The channel region 30 is only surrounded in part by the shallow trench isolation regions 28. In that regard, one of the shallow trench isolation regions 28 may be disposed laterally between the source region 24 and the channel region 30, and another of the shallow trench isolation regions 28 may be disposed laterally between the drain region 26 and the channel region 30.

Figure 2:
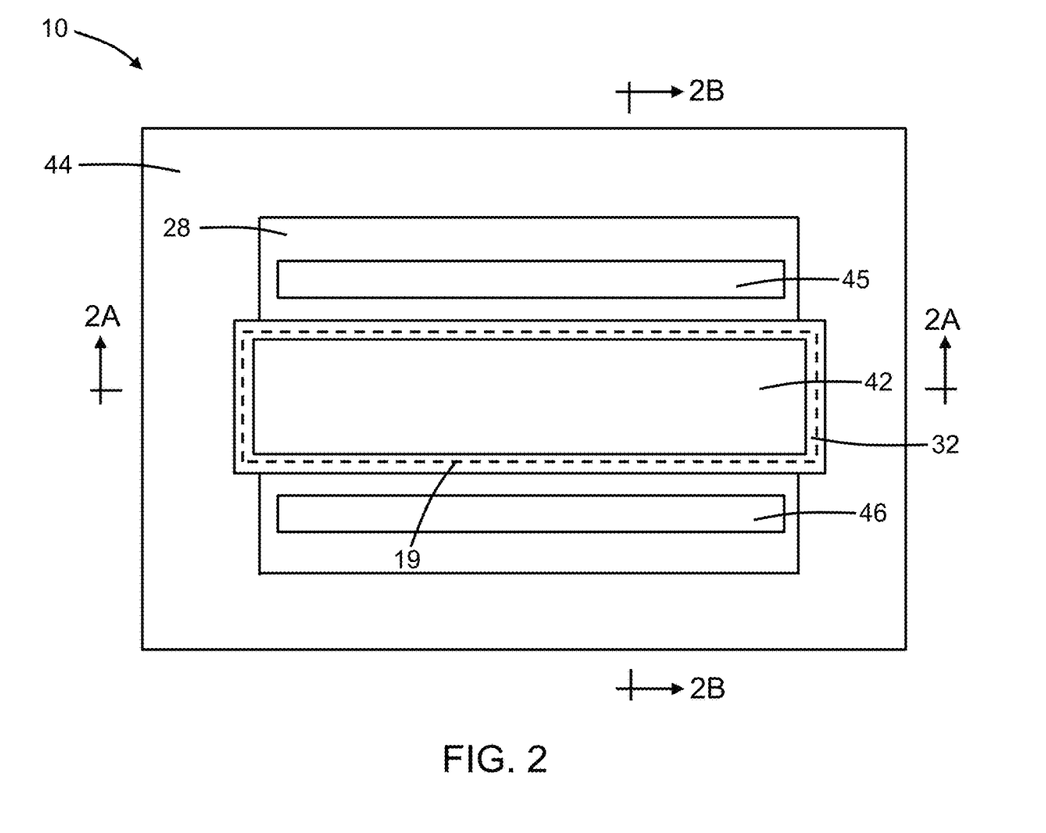
FIG. 2 is a top view of the structure at a fabrication stage of the processing method subsequent to FIG. 1.
Figure 2A:
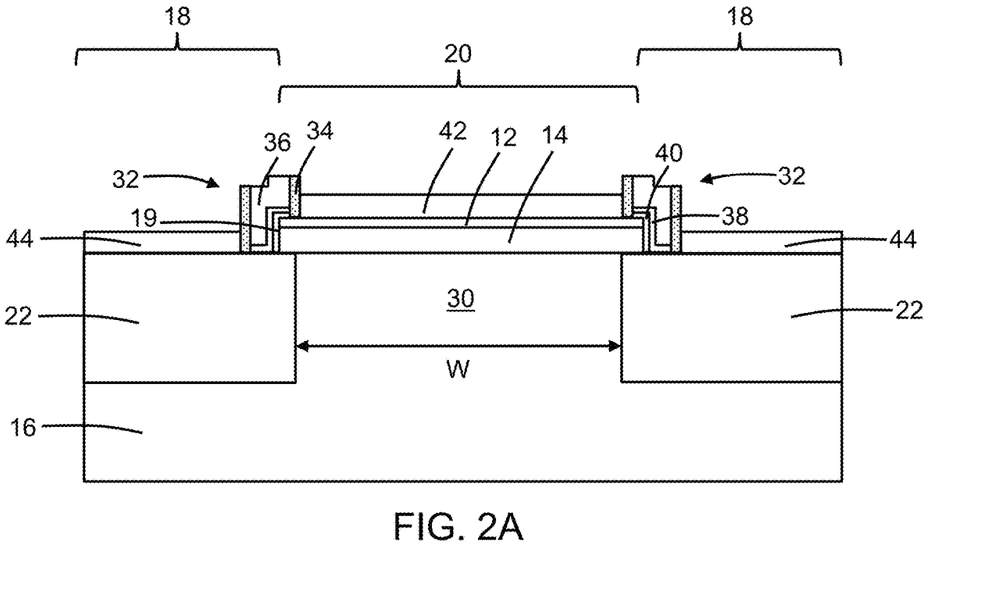
FIG. 2A is a cross-sectional view taken generally along line 2A-2A in FIG. 2.
Figure 2B:
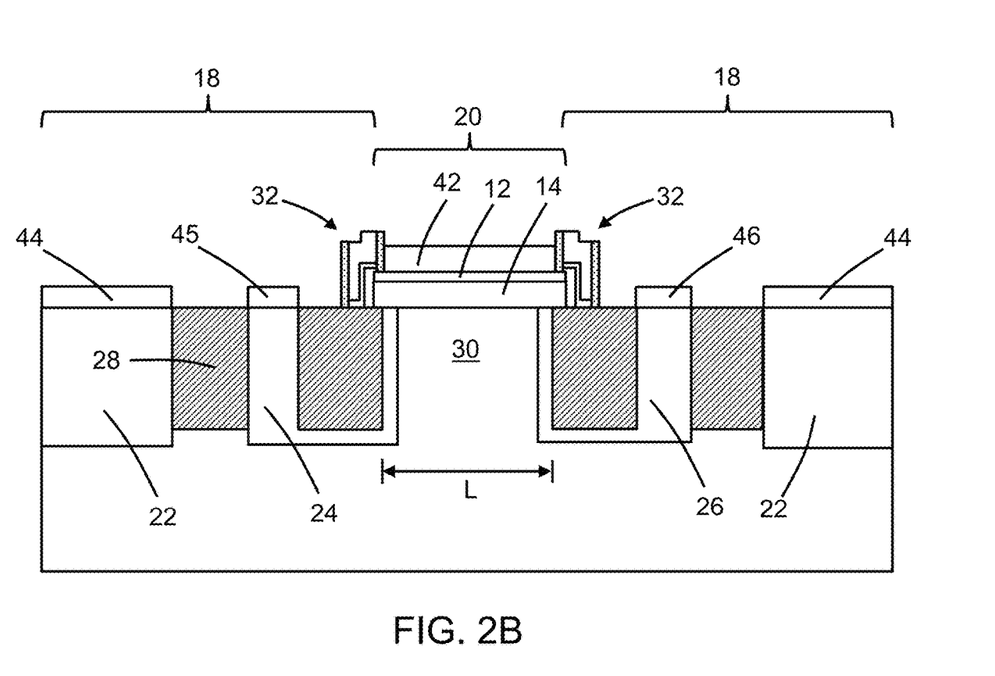
FIG. 2B is a cross-sectional view taken generally along line 2B-2B in FIG. 2.

With reference to FIGS. 2, 2A, 2B in which like reference numerals refer to like features in FIGS. 1, 1A, 1B and at a subsequent fabrication stage, a spacer structure 32 is formed that wraps around the side surface 19 at the transition from region 18, which includes the semiconductor layer 12 and dielectric layer 14, to the region 20, which lacks the semiconductor layer 12 and dielectric layer 14. The spacer structure 32 includes a portion that overlaps with the side surface 19 and contacts the side surface 19. The spacer structure 32 includes a portion that overlaps with a portion of the top surface 13 (FIGS. 1A, 1B) of the semiconductor layer 12 adjacent to the side surface 19 and a portion of the top surface 15 (FIGS. 1A, 1B) of the dielectric layer 14 underlying the overlapped portion of the semiconductor layer 12. The spacer structure 32 includes a portion that overlaps with a portion of the top surface 17 (FIGS. 1A, 1B) of the semiconductor substrate 16 adjacent to the side surface 19. In an embodiment, the portions of the semiconductor layer 12 and the dielectric layer 14 overlapped by the spacer structure 32 may border the side surface 19, and the portion of the semiconductor substrate 16 overlapped by the spacer structure 32 may border the side surface 19. The overlapped portion of the semiconductor substrate 16 includes a portion of the well 22 and lacks any portion of the shallow trench isolation region 28. In an embodiment, a portion of the well 22 may extend beneath the side surface 19, and this portion of the well 22 may be overlapped by the portions of the semiconductor layer 12 and the dielectric layer 14 bordering the side surface 19.

In an embodiment, the portion of the spacer structure 32 overlapping with the side surface 19 may be disposed in direct contact with the semiconductor layer 12 and the dielectric layer 14 adjacent to the side surface 19. In an embodiment, the portion of the spacer structure 32 overlapping with the top surface 13 of the semiconductor layer 12 and the dielectric layer 14 may be disposed in direct contact with the semiconductor layer 12 adjacent to the side surface 19. In an embodiment, the portion of the spacer structure 32 overlapping with the portion of the top surface 17 of the semiconductor substrate 16 may be disposed in direct contact with a portion of the top surface 17 of the semiconductor substrate 16 adjacent to the side surface 19.

The portions of the spacer structure 32 may include a section adjacent to the source region 24 that is lengthwise aligned parallel to the channel width W and transverse to the channel length L, a section adjacent to the drain region 26 that is lengthwise aligned parallel to the channel width W and transverse to the channel length L, and sections adjacent to the portions of the well 22 bordering the channel region 30 that are lengthwise aligned parallel to the channel length L and transverse to the channel width W. In an embodiment, the different sections of the spacer structure 32 may be connected such that the region 20 is fully surrounded at the side surface 19 by the portions of the spacer structure 32.

The spacer structure 32 may include spacers 34 comprised of a dielectric material, such as silicon nitride, that is an electrical insulator and layers 36, 38, 40 that are laterally disposed between the spacers 34. The layer 36 may be comprised of a semiconductor material, such as polysilicon, the layer 38 may be comprised of a high-k dielectric material, such as hafnium oxide, that is an electrical insulator, and the layer 40 may be comprised of a dielectric material, such as silicon dioxide, that is an electrical insulator. In an embodiment, the spacer structure 32 may be formed from the materials used to form the gates of other field-effect transistors on the same chip.

A semiconductor layer 42 may be formed in the region 20 on a central portion of the semiconductor layer 12 that is not overlapped by the spacer structure 32. The semiconductor layer 42, which provides a gate electrode of the field-effect transistor embodied in the structure 10, overlaps with the channel region 30. The outer edge of the semiconductor layer 42 may be laterally offset (i.e., recessed) from the side surface 19 of the semiconductor layer 12 and dielectric layer 14 due to the presence of the spacer structure 32. In an embodiment, the semiconductor layer 42 may also overlap with a portion of the well 22 adjacent to the side surface 19 and beneath the dielectric layer 14. In an alternative embodiment, the well 22 may delimit the channel region 30 without extending beneath the semiconductor layer 42 such that the semiconductor layer 42 lacks an overlapping relationship with any portion of the well 22.

A semiconductor layer 44 may be formed in the region 18 on the portion of the semiconductor substrate 16 that is not overlapped by the spacer structure 32. The semiconductor layer 44 provides a well connector that is coupled to the well 22 disposed in the semiconductor substrate 16. The semiconductor layer 44 is laterally offset from the side surface 19 of the semiconductor layer 12 and dielectric layer 14 due to the presence of the spacer structure 32.

The semiconductor layers 42, 44 may be comprised of single-crystal semiconductor material formed by an epitaxial growth process. As used herein, a single-crystal semiconductor material is characterized by a continuous crystal lattice and the absence of grain boundaries. The single-crystal semiconductor material of the semiconductor layer 12 has a crystal structure that serves as a crystalline template during epitaxial growth for the crystal structure of the single-crystal semiconductor material of the semiconductor layer 42. The single-crystal semiconductor material of the semiconductor substrate 16 has a crystal structure that serves as a crystalline template during epitaxial growth for the crystal structure of the single-crystal semiconductor material of the semiconductor layer 44. In an embodiment, the semiconductor layers 42, 44 may be formed by the same epitaxial growth process. In an embodiment, the semiconductor layers 42, 44 may be doped during epitaxial growth with a concentration of a p-type dopant, such as boron, that provides p-type conductivity. The spacer structure 32 electrically isolates the semiconductor layer 44 from the semiconductor layer 42.

A semiconductor layer 45 may be epitaxially grown on the source region 24 and a semiconductor layer 46 may be epitaxially grown on the drain region 26. The semiconductor layers 45, 46 may be doped to have an opposite conductivity type from the semiconductor layers 42, 44. In an embodiment, the semiconductor layers 45, 46 may be doped during epitaxial growth with a concentration of an n-type dopant, such as phosphorus or arsenic, that provides n-type conductivity.

The well 22 includes sections that are disposed at opposite ends of the gate electrode provided by the semiconductor layer 42 in the direction of the channel width W of the channel region 30. Each of these sections of the well 22 adjoins a portion of the channel region 30 and the semiconductor layer 42 is disposed between these sections of the well 22. The distance across the channel region 30 between these sections of the well 22 may provide a measure of the channel width W. These sections of the well 22 are disposed adjacent to the side surface 19 of the dielectric layer 14 and are coextensive at the top surface 17 of the semiconductor substrate 16 with the side surface 19.

In the representative embodiment, the dopant types are selected for forming an n-type field-effect transistor. In an alternative embodiment, the dopant types may be selected for forming a p-type field-effect transistor.

Figure 3:
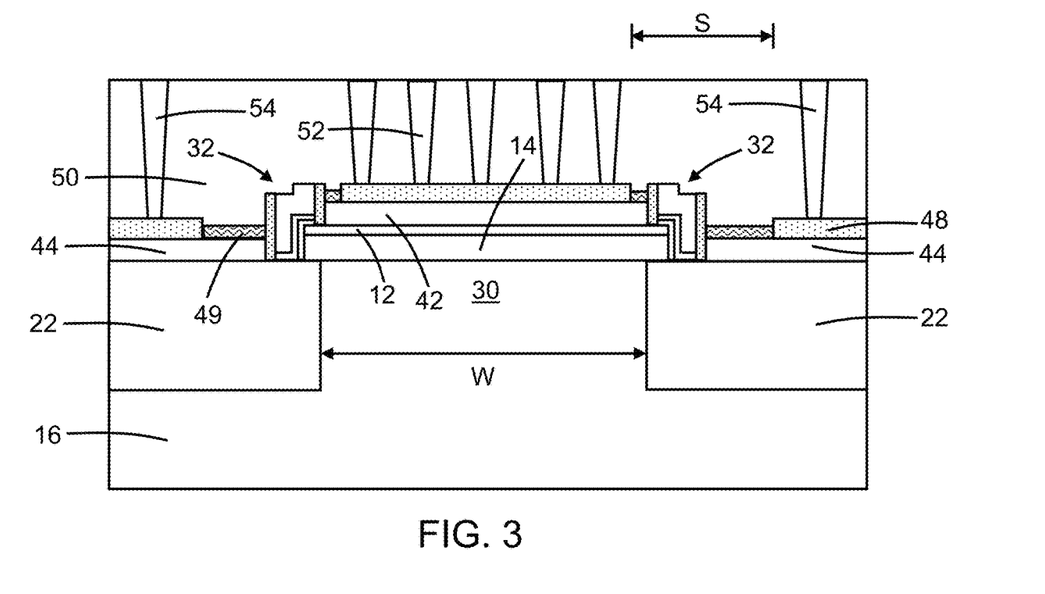
FIG. 3 is a cross-sectional view of the structure at a fabrication stage of the processing method subsequent to FIGS. 2, 2A, 2B.

With reference to FIG. 3 in which like reference numerals refer to like features in FIGS. 2, 2A, 2B and at a subsequent fabrication stage, a silicide layer 48 may be formed that includes a section on the semiconductor layer 42 and a section on the semiconductor layer 44. A section of the silicide layer 48 may also form on the semiconductor layers 45, 46 and, although not shown, on the top surface of the layer 36 of the spacer structure 32. A dielectric layer 50 may be formed, gate contacts 52 may be formed in the dielectric layer 50 that are coupled to the section of the silicide layer 48 on the semiconductor layer 42, and well contacts 54 may be formed in the dielectric layer 50 that are coupled to the section of the silicide layer 48 on the semiconductor layer 44.

The silicide layer 48 may be formed by a silicidation process that involves one or more annealing steps to form a silicide phase by reacting the semiconductor material of the semiconductor layer 12 and the semiconductor material of the semiconductor substrate 16 with a contacting layer comprised of a silicide-forming metal, such as nickel. An initial annealing step of the silicidation process may consume all or part of the silicide-forming metal. Following the initial annealing step, any non-reacted silicide-forming metal may be removed by wet chemical etching. The silicide layer 48 may then be subjected to an additional annealing step at a higher temperature to form a lower-resistance silicide phase.

The section of the silicide layer 48 on the semiconductor layer 44 may be offset from the semiconductor layer 42 to increase the separation distance S between the section of the silicide layer 48 and the semiconductor layer 42. The increased separation distance S may function to increase the breakdown voltage between the semiconductor layer 44 and the semiconductor substrate 16. In the absence of trench isolation regions in the sections of the well 22 between the semiconductor layer 42 and the semiconductor layer 44, the separation S may be provided by applying a silicide-blocking layer 49 on the portion of the semiconductor layer 44 adjacent to the spacer structure 32. In an alternative embodiment, the semiconductor layer 44 may be fully silicided. In an embodiment, the section of the silicide layer 48 on the semiconductor layer 42 may likewise be offset inward from the spacer structure 32.

Figure 4:
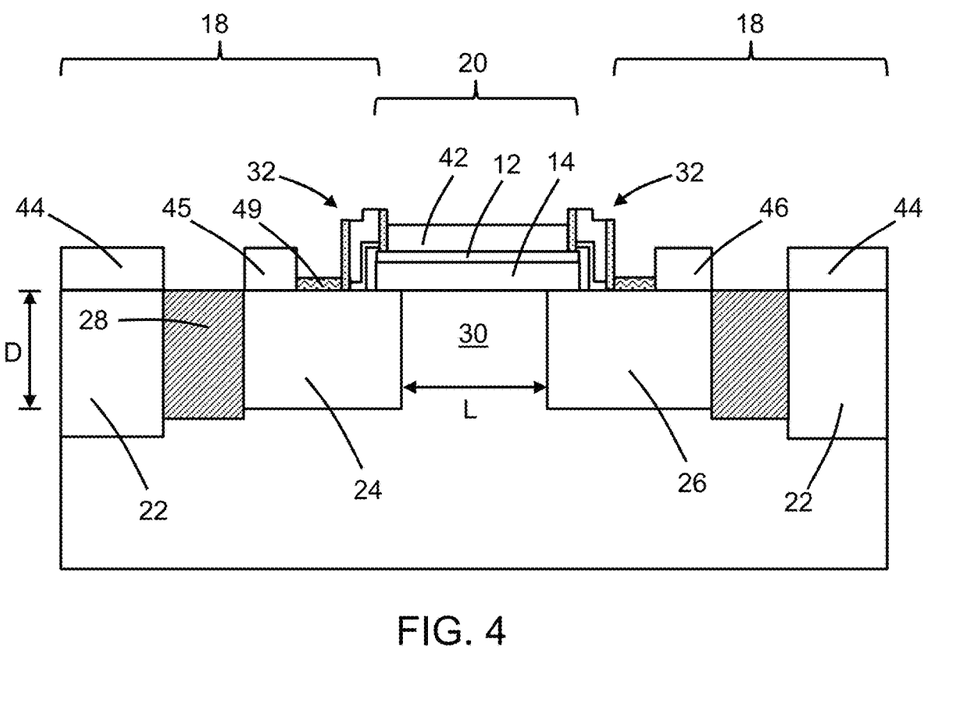
FIG. 4 is a cross-sectional view of a structure in accordance with alternative embodiments of the invention.

With reference to FIG. 4 and in accordance with alternative embodiments, the shallow trench isolation region 28 between the source region 24 and the channel region 30 may be omitted, and the shallow trench isolation region 28 between the drain region 26 and the channel region 30 may be omitted. The source region 24 may directly adjoin a portion of the channel region 30, the drain region 26 may directly adjoin a portion of the channel region 30 opposite from the portion of the channel region 30 adjoined by the source region 24, and the channel length L may be measured between the source region 24 and the drain region 26. A portion of the side surface 19 overlaps with the top surface 17 of the semiconductor substrate 16 above the source region 24 and a different portion of the side surface 19 overlaps with the top surface 17 of the semiconductor substrate 16 above the drain region 26. The omission of these shallow trench isolation regions 28 may enable a reduction in the depth of the source region 24 and the drain region 26 in the semiconductor substrate 16. Specifically, the source region 24 and the drain region 26 in the semiconductor substrate 16 may extend to a depth D that is less than the depth of the remaining shallow trench isolation regions 28 separating the source region 24 and the drain region 26 from the well 22.

The omission of the shallow trench isolation region 28 between the source region 24 and channel region 30 and the omission of the shallow trench isolation region 28 between the drain region 26 and channel region 30 may function to eliminate a parasitic transistor from the structure 10. The reduced depth of the source region 24 and the drain region 26 may improve device performance and channel control by effectively shortening the current path in the channel region 30 between the source region 24 and drain region 26.

The channel length L of the field-effect transistor embodied in the structure 10 is not delimited by the presence of the shallow trench isolation regions 28 at the transition between the region 18 and the region 20. In an embodiment, the channel width W of the field-effect transistor embodied in the structure 10 may also not be delimited by the presence of the shallow trench isolation regions 28 at the transition between the region 18 and the region 20. In an alternative embodiment, the channel width W of the field-effect transistor embodied in the structure 10 may be delimited by the presence of the shallow trench isolation regions 28 at the transition between the region 18 and the region 20.

Figure 5:
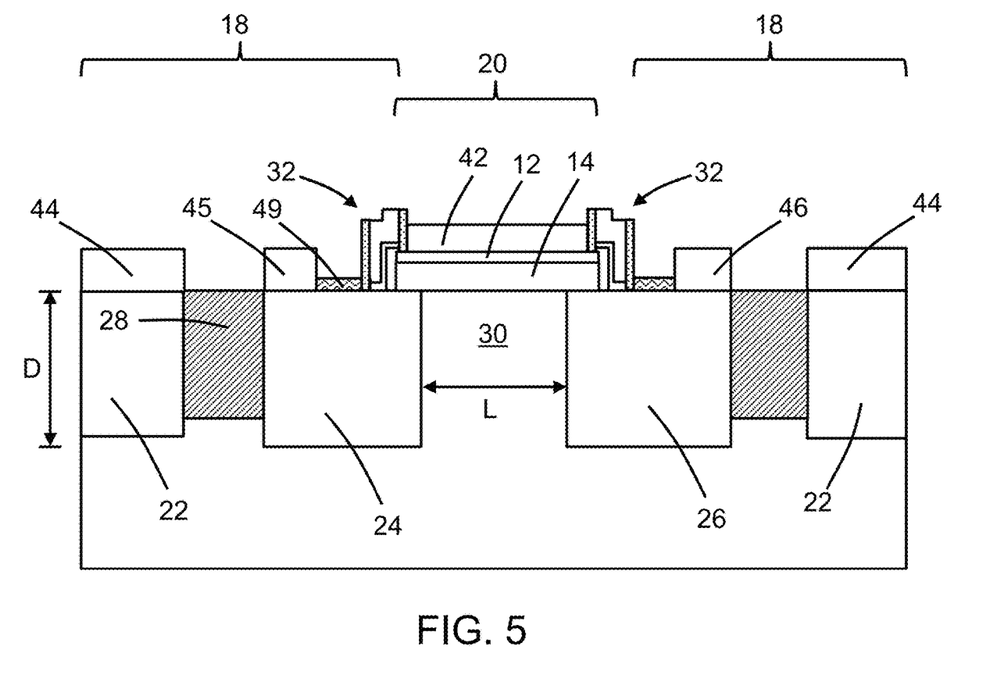
FIG. 5 is a cross-sectional view of a structure in accordance with alternative embodiments of the invention.

With reference to FIG. 5 in which like reference numerals refer to like features in FIG. 4 and in accordance with alternative embodiments, the source region 24 and the drain region 26 in the semiconductor substrate 16 may extend to a depth that is greater than the depth of the remaining shallow trench isolation regions 28 providing separation from the well 22.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:
   a silicon-on-insulator substrate including a semiconductor substrate, a dielectric layer on the semiconductor substrate, and a semiconductor layer on the dielectric layer, the dielectric layer having a side surface, and the semiconductor substrate having a portion adjacent to the side surface of the dielectric layer;
a gate electrode on a first portion of the semiconductor layer, the gate electrode comprising a single-crystal semiconductor material;
a source region in the semiconductor substrate;
a drain region in the semiconductor substrate;
a channel region in the semiconductor substrate, the channel region laterally between the source region and the drain region; and
a spacer structure including a first portion that directly contacts the side surface of the dielectric layer and a second portion that directly contacts the portion of the semiconductor substrate, the spacer structure including a first spacer, a second spacer, and a layer laterally between the first spacer and the second spacer, the first spacer and the second spacer comprising a first dielectric material, and the layer comprising a semiconductor material.

2. The structure of claim 1 wherein the semiconductor layer includes a second portion between the side surface of the dielectric layer and the gate electrode, and the spacer structure includes a third portion that overlaps with the second portion of the semiconductor layer.

3. The structure of claim 1 further comprising:
a well in the portion of the semiconductor substrate, the well including a first section and a second section, and the gate electrode disposed between the first section of the well and the second section of the well,
wherein the first portion and the second portion of the spacer structure have a first section adjacent to the first section of the well and a second section adjacent to the second section of the well.

4. The structure of claim 3 wherein the gate electrode overlaps with the channel region, the first section of the well adjoins a first portion of the channel region, and the second section of the well adjoins a second portion of the channel region.

5. The structure of claim 4 wherein the channel region has a channel width between the first section of the well and the second section of the well.

6. The structure of claim 5 wherein the first section of the spacer structure and the second section of the spacer structure are lengthwise aligned transverse to the channel width.

7. The structure of claim 6 wherein the channel region has a channel length between the source region and the drain region.

8. The structure of claim 1 wherein the semiconductor substrate has a top surface, the side surface of the dielectric layer overlaps with the top surface of the semiconductor substrate above the source region and above the drain region, and the first portion and the second portion of the spacer structure include a first section adjacent to the source region and a second section adjacent to the drain region.

9. The structure of claim 8 wherein the gate electrode overlaps with the channel region, the channel region adjoins the source region, and the channel region adjoins the drain region.

10. The structure of claim 9 wherein the channel region has a channel length between the source region and the drain region, and the first section and the second section of the spacer structure are lengthwise aligned transverse to the channel length.

11. The structure of claim 1 wherein the side surface of the dielectric layer represents a stepped transition from the dielectric layer and the semiconductor layer to the portion of the semiconductor substrate.

12. The structure of claim 1 wherein the spacer structure fully surrounds the side surface of the dielectric layer.

13. The structure of claim 1 wherein the spacer structure fully surrounds the gate electrode.

14. The structure of claim 1 further comprising:
a well in the semiconductor substrate, the well including a section adjacent to the side surface of the dielectric layer;
a well connector on the section of the well, the well connector comprising a second semiconductor material; and
a silicide layer including a first section on a portion of the well connector, the first section of the silicide layer laterally spaced on the well connector from the spacer structure.

15. The structure of claim 14 wherein the silicide layer includes a second section on the gate electrode, and the second section of the silicide layer is laterally spaced on the gate electrode from the spacer structure.

16. The structure of claim 1 further comprising:
a well in the semiconductor substrate, the well including a first section and a second section that are adjacent to the side surface,
wherein the second portion of the spacer structure includes a first section that is disposed over the first section of the well and a second section that is disposed over the second section of the well.

17. The structure of claim 1 further comprising:
a well in the semiconductor substrate,
wherein the side surface of the dielectric layer overlaps with a section of the well.

18. The structure of claim 1 wherein the semiconductor substrate has a top surface, and the side surface of the dielectric layer terminates at the top surface of the semiconductor substrate.

19. A method of forming a structure for a field-effect transistor, the method comprising:
forming a gate electrode on a portion of a semiconductor layer of a silicon-on-insulator substrate, wherein the silicon-on-insulator substrate includes a semiconductor substrate and a dielectric layer disposed on the semiconductor substrate, the semiconductor layer is disposed on the dielectric layer, and the dielectric layer has a side surface;
forming a source region and a drain region in the semiconductor substrate, wherein a channel region in the semiconductor substrate is laterally between the source region and the drain region; and
forming a spacer structure including a first portion that directly contacts the side surface of the dielectric layer and a second portion that directly contacts the portion of the semiconductor substrate, wherein the spacer structure includes a first spacer, a second spacer, and a layer laterally between the first spacer and the second spacer, the first spacer and the second spacer comprise a dielectric material, and the layer comprises a semiconductor material.

20. The structure of claim 1 further comprising:
a first shallow trench isolation region in the semiconductor substrate; and
a second shallow trench isolation region in the semiconductor substrate,
wherein the first shallow trench isolation region and the second shallow trench isolation region partially surround the channel region, and the first shallow trench isolation region and the second shallow trench isolation region comprise a second dielectric material different from the first dielectric material.

\* \* \* \* \*